(12) United States Patent
Nomura et al.

(10) Patent No.: US 6,928,096 B2
(45) Date of Patent: Aug. 9, 2005

(54) NITRIDE-BASED SEMICONDUCTOR LASER DEVICE AND METHOD OF FABRICATING THE SAME

(75) Inventors: Yasuhiko Nomura, Moriguchi (JP); Tatsuya Kunisato, Takatsuki (JP)

(73) Assignee: Sanyo Electric Co., Ltd., Osaka (JP)

( * ) Notice: Subject to any disclaimer, the term of this patent is extended or adjusted under 35 U.S.C. 154(b) by 15 days.

(21) Appl. No.: 10/114,298

(22) Filed: Apr. 3, 2002

(65) Prior Publication Data

US 2002/0146866 A1 Oct. 10, 2002

(30) Foreign Application Priority Data

Apr. 6, 2001 (JP) ........................................ 2001-108366

(51) Int. Cl.$^7$ ................................................ H01S 5/00
(52) U.S. Cl. ............................................ 372/46; 372/45
(58) Field of Search ..................... 372/43–46, 49, 372/50

(56) References Cited

U.S. PATENT DOCUMENTS

| | | | | |
|---|---|---|---|---|
| 5,151,913 A | * | 9/1992 | Ueno | 372/46 |
| 5,574,741 A | * | 11/1996 | Arimoto | 372/45 |
| 5,737,351 A | * | 4/1998 | Ono | 372/45 |
| 5,751,013 A | * | 5/1998 | Kidoguchi et al. | 372/45 |
| 5,815,522 A | * | 9/1998 | Nagai | 372/46 |
| 6,278,720 B1 | * | 8/2001 | Lee et al. | 372/46 |
| 2003/0012241 A1 | * | 1/2003 | Onishi | 372/46 |

OTHER PUBLICATIONS

"InGaN/GaN/AlGaN–based laser diodes with modulation–doped strained–layer superlattices grown on an epitaxially overgrown GaN substrate" Shunji Nakamura et al., Appl. Phys. Lett. 72 (2), Jan. 12, 1998, American Institute of Physics, pp. 211–213.

"High–Power and Long–Lifetime InGaN Multi–Quantum–Well Laser Diodes Grown on Low–Dislocation–Density GaN Substrates" Shin–ichi Nagahama, Jpn. J. Appl. Phys. vol. 39 (2000) pp. L647–L650, Part 2, No. 7A, Jul. 1, 2000.

* cited by examiner

Primary Examiner—Minsun Oh Harvey
Assistant Examiner—James Menefee
(74) Attorney, Agent, or Firm—McDermott Will & Emery LLP

(57) ABSTRACT

A nitride-based semiconductor laser device capable of preventing deterioration in the vicinity of a facet is obtained. This nitride-based semiconductor laser device comprises a first conductivity type first cladding layer consisting of a nitride-based semiconductor formed on a substrate, an active layer formed on the first cladding layer, a second conductivity type second cladding layer consisting of a nitride-based semiconductor formed on the active layer and a high-resistance region formed at least portions of the active layer and the second cladding layer in the vicinity of the facet. The high-resistance region has higher resistance than the remaining regions, whereby a current hardly flows to the high-resistance region. Thus, temperature increase is suppressed in the vicinity of the facet, whereby deterioration can be prevented in the vicinity of the facet.

20 Claims, 9 Drawing Sheets

NITRIDE-BASED SEMICONDUCTOR LASER DEVICE AND METHOD OF FABRICATING THE SAME

BACKGROUND OF THE INVENTION

1. Field of the Invention

The present invention relates to a nitride-based semiconductor laser device and a method of fabricating the same, and more particularly, it relates to a nitride-based semiconductor laser device having a facet and a method of fabricating the same.

2. Description of the Prior Art

A nitride-based semiconductor laser device is recently expected as a light source for a future large capacity disk, and actively developed. The recording speed of a recording optical disk system must be increased due to the rapid enlargement of the market for the recording optical disk system represented by a CD-ROM. In order to increase the recording speed of the recording optical disk system, the light output power of the nitride-based semiconductor laser device must inevitably be increased. Thus, the technique for increasing the light output power of the nitride-based semiconductor laser is extremely important.

FIG. 20 is a perspective view showing a conventional nitride-based semiconductor laser device. Referring to FIG. 20, an n-type contact layer 102 of n-type GaN having a thickness of about 5 $\mu$m, an n-type cladding layer 103 of n-type AlGaN having a thickness of about 1 $\mu$m and an active layer 104 having a thickness of about 0.1 $\mu$m are formed on a sapphire substrate 101 in the conventional nitride-based semiconductor laser device. A p-type cladding layer 105 of p-type AlGaN having a projection is formed on the active layer 104. A p-type contact layer 106 of p-type GaN is formed on the projection of the p-type cladding layer 105. The projection of the p-type cladding layer 105 and the p-type contact layer 106 form a ridge portion. A p-side ohmic electrode 107 having a thickness of about 0.5 $\mu$m is formed on the p-type contact layer 106 to be in contact with the overall upper surface of the p-type contact layer 106.

The layers from the p-type cladding layer 105 to the n-type contact layer 102 are partially removed. Current blocking layers 108 of SiO$_2$ are formed to cover part of the exposed upper surface of the n-type contact layer 102, exposed side surfaces of the n-type contact layer 102, the n-type cladding layer 103, the active layer 104 and the p-type cladding layer 105, the upper surface of the p-type cladding layer 105 and the side surfaces of the ridge portion. A p-side pad electrode 109 having a thickness of about 1 $\mu$m is formed on the current blocking layers 108 to be in contact with the p-side ohmic electrode 107 formed on the upper surface of the ridge portion.

An n-side ohmic electrode 110 is formed on a surface part of the n-type contact layer 102 exposed by partial removal. An n-side pad electrode 111 is formed on the n-side ohmic electrode 110.

In the conventional nitride-based semiconductor laser device having the aforementioned structure, a current flows from the p-side pad electrode 109 to the active layer 104, the n-type cladding layer 103, the n-type contact layer 102, the n-side ohmic electrode 110 and the n-side pad electrode 111 through the p-side ohmic electrode 107 as well as the p-type contact layer 106 and the p-type cladding layer 105 forming the ridge portion. Thus, a laser beam can be emitted in a region of the active layer 104 located under the ridge portion.

The aforementioned conventional nitride-based semiconductor laser device is formed by cutting the wafer prepared by forming the aforementioned layers and electrodes 102 to 111 on the sapphire substrate 101 into a prescribed size. In this case, a facet of the nitride-based semiconductor laser device cut from the wafer is formed by cleavage or dry etching for emitting laser beam. The facet functions as a reflector of a cavity.

When the facet of the conventional nitride-based semiconductor laser device is formed by cleavage, the facet is readily damaged due to stronger mechanical strength of the nitride-based semiconductor as compared with other compounds such as GaAs and GaInP. Particularly in the conventional nitride-based semiconductor laser device shown in FIG. 20 having the layers 102 to 106 consisting of nitride-based semiconductors formed on the sapphire substrate 101, the crystal axes of sapphire and the nitride-based semiconductors mismatch with each other and hence readily cleavable directions of the sapphire substrate 101 and the nitride-based semiconductors also mismatch with each other. Therefore, the facet of the conventional nitride-based semiconductor laser device shown in FIG. 20 is readily damaged when the same is formed by cleavage. In this case, the facet formed by cleavage may be uneven.

In order to substantially vertically form a facet of a nitride-based semiconductor laser device by dry etching such as RIE (reactive ion etching), a physical etching element must be strengthened. When the physical etching element is strengthened, however, the facet formed by etching is readily damaged. In order to form a facet of a conventional nitride-based semiconductor laser device by etching, an etching mask is generally prepared from SiO$_2$. An end face of this etching mask of SiO$_2$ is uneven in a striped manner in etching. In this case, the facet of the nitride-based semiconductor laser device formed by dry etching reflects the shape of the etching mask. When the facet of the nitride-based semiconductor laser device is formed through the etching mask of SiO$_2$, therefore, the facet of the nitride-based semiconductor laser device is also uneven in a striped manner.

As hereinabove described, the facet of the conventional nitride-based semiconductor laser device is remarkably damaged and uneven dissimilarly to a GaAs- or AlGaInP-based semiconductor laser device. Thus, the n-type cladding layer 103, the active layer 104 and the p-type cladding layer 105 on the facet are remarkably damaged and uneven in the conventional nitride-based semiconductor laser device, to increase the number of crystal defects in the vicinity of the facet. When a current is injected into the conventional nitride-based semiconductor laser device, therefore, a non-radiative recombination current emitting no light flows in the vicinity of the facet. This non-radiative recombination current increases the temperature in the vicinity of the facet and absorbs the laser beam. Thus, the band gap in the vicinity of the facet is reduced to further increase absorption of the laser beam in the vicinity of the facet. The conventional nitride-based semiconductor laser device is disadvantageously deteriorated in the vicinity of the facet by repeating the aforementioned process.

SUMMARY OF THE INVENTION

An object of the present invention is to provide a nitride-based semiconductor laser device capable of preventing deterioration in the vicinity of a facet.

Another object of the present invention is to provide a method of fabricating a nitride-based semiconductor laser device capable of preventing deterioration in the vicinity of a facet.

A nitride-based semiconductor laser device according to a first aspect of the present invention comprises a first conductivity type first cladding layer consisting of a nitride-based semiconductor formed on a substrate, an active layer formed on the first cladding layer, a second conductivity type second cladding layer consisting of a nitride-based semiconductor formed on the active layer and a high-resistance region formed at least on portions of the active layer and the second cladding layer in the vicinity of a facet.

The semiconductor laser device according to the first aspect is provided with the high-resistance region formed at least on the portions of the active layer and the second cladding layer in the vicinity of the facet as hereinabove described, whereby a current hardly flows to the high-resistance region having higher resistance than the remaining regions. Thus, temperature increase is suppressed in the vicinity of the facet, whereby deterioration can be prevented in the vicinity of the facet.

In the aforementioned nitride-based semiconductor laser device according to the first aspect, the high-resistance region is preferably formed also on a portion of the first cladding layer in the vicinity of the facet. According to this structure, the current more hardly flows to the portion of the first cladding layer in the vicinity of the facet. Thus, temperature increase is further suppressed in the vicinity of the facet, whereby deterioration can be prevented in the vicinity of the facet.

In the aforementioned nitride-based semiconductor laser device according to the first aspect, the high-resistance region is preferably formed by introducing an impurity. According to this structure, the high-resistance region can be readily formed. In this case, the impurity introduced into the high-resistance region preferably has a lower second conductivity type activation efficiency than an impurity previously introduced into the second cladding layer. When the impurity having a lower second conductivity type activation efficiency than the impurity previously introduced into the second cladding layer is introduced, the high-resistance region can be readily formed. In this case, the impurity preferably includes an element selected from a group consisting of Be, Zn, Ca, C and Si, and the impurity previously introduced into the second cladding layer is preferably Mg. According to this structure, the high-resistance region can be readily formed. In this case, the impurity may be Zn, and the impurity previously introduced into the second cladding layer may be Mg.

The aforementioned nitride-based semiconductor laser device according to the first aspect preferably further comprises a current blocking layer formed at least above the high-resistance region. According to this structure, the current more hardly flows in the vicinity of the facet, whereby deterioration can be further suppressed on the facet. In this case, the current blocking layer may include an $SiO_2$ film. Further, the current blocking layer may include a layer consisting of a material having a first conductivity type.

In the nitride-based semiconductor laser device according to the first aspect, the active layer preferably has a periodic structure consisting of any of a quantum well structure, a quantum wire structure and a quantum box structure, and the periodic structure of the active layer in the high-resistance region formed by introducing the impurity is preferably disordered. According to this structure, the band gap of the active layer in the high-resistance region is larger than the band gap of the active layer in the regions other than the high-resistance region, whereby absorption of a laser beam can be suppressed in the high-resistance region. Consequently, deterioration can be more effectively prevented in the vicinity of the facet.

A method of fabricating a nitride-based semiconductor laser device according to a second aspect of the present invention comprises steps of forming a first conductivity type first cladding layer consisting of a nitride-based semiconductor on a substrate, forming an active layer on the first cladding layer, forming a second conductivity type second cladding layer consisting of a nitride-based semiconductor on the active layer and forming a high-resistance region by introducing an impurity into portions of the first cladding layer, the active layer and the second cladding layer in the vicinity of a facet.

In the method of fabricating a nitride-based semiconductor laser device according to the second aspect, the high-resistance region is formed by introducing the impurity into the portions of the first cladding layer, the active layer and the second cladding layer in the vicinity of the facet as hereinabove described, whereby a current hardly flows to the high-resistance region having higher resistance than the remaining regions. Thus, temperature increase is suppressed in the vicinity of the facet. Consequently, a nitride-based semiconductor laser device capable of preventing deterioration in the vicinity of the facet can be readily formed.

In the aforementioned method of fabricating a nitride-based semiconductor laser device according to the second aspect, the step of forming the high-resistance region preferably includes a step of forming a layer containing the impurity on the second cladding layer and thereafter thermally diffusing the impurity into the portions of the second cladding layer, the active layer and the first cladding layer in the vicinity of the facet from the layer containing the impurity thereby forming the high-resistance region on the portions of the second cladding layer, the active layer and the first cladding layer in the vicinity of the facet. When such thermal diffusion is employed, the high-resistance region can be readily formed in the vicinity of the facet. In this case, the layer containing the impurity preferably includes a ZnO film. According to this structure, Zn contained in the ZnO film can be readily thermally diffused in the vicinity of the facet.

In the aforementioned method of fabricating a nitride-based semiconductor laser device according to the second aspect, the step of forming the high-resistance region preferably includes a step of ion-implanting the impurity into the second cladding layer, the active layer and the first cladding layer thereby forming the high-resistance region on the portions of the first cladding layer, the active layer and the second cladding layer in the vicinity of the facet. When such ion implantation is employed, the high-resistance region can be readily formed in the vicinity of the facet. In this case, the step of forming the high-resistance region preferably includes steps of forming a mask layer having an opening in the vicinity of the facet and ion-implanting the impurity into the second cladding layer, the active layer and the first cladding layer through the mask layer serving as a mask thereby forming the high-resistance region. According to this structure, the impurity can be ion-implanted only in the vicinity of the facet.

In the aforementioned method of fabricating a nitride-based semiconductor laser device employing ion implantation, the step of forming the high-resistance region preferably includes a step of diffusing the ion-implanted impurity by performing heat treatment after the ion implantation. According to this structure, the high-resistance region can be readily formed by ion implantation and heat treatment.

In the aforementioned method of fabricating a nitride-based semiconductor laser device according to the second aspect, the impurity introduced into the high-resistance region preferably has a lower second conductivity type activation efficiency than an impurity previously introduced into the second cladding layer. When the impurity having a lower second conductivity type activation efficiency than the impurity previously introduced into the second cladding layer is introduced, the high-resistance region can be readily formed. In this case, the impurity preferably includes an impurity selected from a group consisting of Be, Zn, Ca, C and Si, and the impurity previously introduced into the second cladding layer is preferably Mg. According to this structure, the high-resistance region can be readily formed. In this case, the impurity may be Zn, and the impurity previously introduced into the second cladding layer may be Mg.

The aforementioned method of fabricating a nitride-based semiconductor laser device according to the second aspect preferably further comprises a step of forming a current blocking layer at least above the high-resistance region. According to this structure, the current more hardly flows in the vicinity of the facet, whereby deterioration can be further suppressed in the vicinity of the facet. In this case, the current blocking layer may include an $SiO_2$ film. Further, the current blocking layer may include a layer consisting of a material having a first conductivity type.

In the aforementioned method of fabricating a nitride-based semiconductor laser device according to the second aspect, the active layer preferably has a periodic structure consisting of any of a quantum well structure, a quantum wire structure and a quantum box structure, and the step of forming the high-resistance region preferably includes a step of disordering the periodic structure of the active layer in the vicinity of the facet by introducing the impurity into the portions of the second cladding layer, the active layer and the first cladding layer in the vicinity of the facet. According to this structure, the band gap of the active layer in the high-resistance region is larger than the band gap of the active layer in the regions other than the high-resistance region, whereby absorption of a laser beam can be suppressed in the high-resistance region. Consequently, a nitride-based semiconductor laser device capable of more effectively preventing deterioration in the vicinity of the facet can be readily formed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

(First Embodiment)

A method of fabricating a nitride-based semiconductor laser device according to a first embodiment of the present invention is described with reference to FIGS. 1 to 12.

Figure 1:
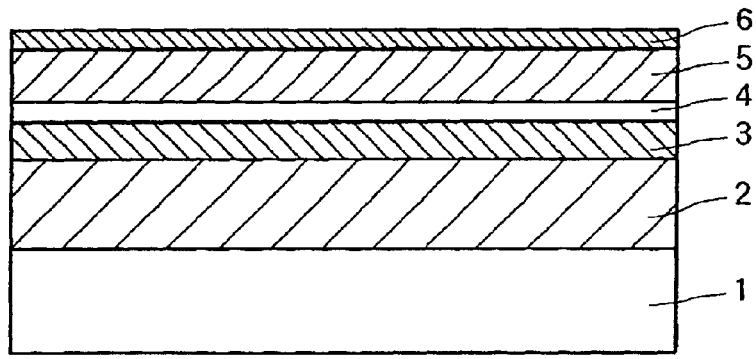
FIGS. 1 and 2 are sectional views of a nitride-based semiconductor laser device along a direction perpendicular to a cavity direction for illustrating a method of fabricating a nitride-based semiconductor laser device according to a first embodiment of the present invention.

As shown in FIG. 1, an n-type contact layer 2 of GaN having a thickness of about 4 µm, an n-type cladding layer 3 of AlGaN having a thickness of about 1 µm and an MQW active layer 4 having a multiple quantum well (MQW) structure are successively formed on a sapphire substrate 1 by MOCVD (metal organic chemical vapor deposition). The MQW active layer 4 is formed by alternately stacking three $In_xGa_{1-x}N$ quantum well layers of about 8 nm in thickness and four $In_yGa_{1-y}N$ quantum barrier layers of about 16 nm in thickness. Therefore, the MQW active layer 4 has a thickness of about 88 nm. X is greater than Y (X>Y). According to the first embodiment, X and Y are equal to 0.13 and 0.05 respectively.

The sapphire substrate 1 is an example of the "substrate" according to the present invention, and the n-type cladding layer 3 is an example of the "first cladding layer" according to the present invention. The MQW active layer 4 is an example of the "active layer" according to the present invention.

Then, a p-type cladding layer 5 of AlGaN having a thickness of about 0.3 µm and a p-type contact layer 6 of GaN having a thickness of about 0.07 µm are successively formed on the MQW active layer 4 by MOCVD. The p-type cladding layer 5 is an example of the "second cladding layer" according to the present invention. Si is used as the n-type dopant for the n-type contact layer 2 and the n-type cladding layer 3, while Mg is used as the p-type dopant for the p-type cladding layer 5 and the p-type contact layer 6.

Figure 2:
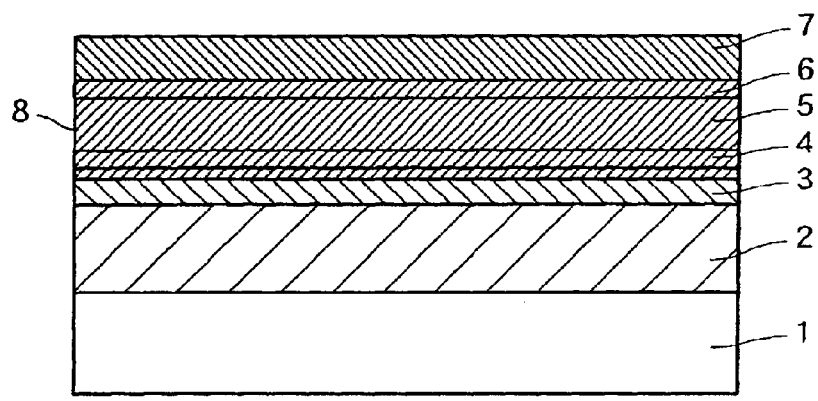
Figure 3:
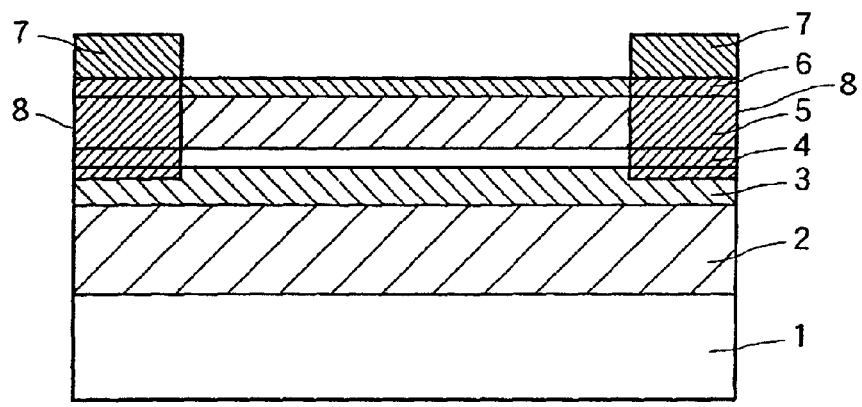
FIG. 3 is a side elevational view of the nitride-based semiconductor laser device according to the first embodiment shown in FIG. 2.

Then, a ZnO film having a thickness of about 0.2 µm is formed on the p-type contact layer 6, and patterned by photolithography and wet etching. Thus, ZnO films 7 having a length of about 40 µm in a cavity direction are formed on regions close to facets in a cycle (the length of a cavity of the nitride-based semiconductor laser device according to the first embodiment) of about 1000 µm as shown in FIGS. 2 and 3. Referring to FIG. 3 corresponding to a single nitride-based semiconductor laser device, the length of the ZnO films 7 along the cavity direction is about 20 µm.

Thereafter this wafer is arranged in a thermal diffusion furnace held at a temperature of about 800° C. and annealed for about 30 minutes. Thus, Zn contained in the ZnO films 7 is thermally diffused downward and introduced into partial regions of the p-type cladding layer 5, the MQW active layer 4 and the n-type cladding layer 3 through the p-type contact layer 6. Consequently, high-resistance regions 8 are formed on the regions, containing the introduced Zn, located under the ZnO films 7 in the vicinity of the facets. Zn having a lower p-type activation efficiency than Mg is introduced into the p-type cladding layer 5 previously doped with Mg, whereby the high-resistance regions 8 exhibit higher resistance than the region of the p-type cladding layer 5 containing no Zn. Thereafter the ZnO films 7 are removed.

Then, an $SiO_2$ film (not shown) is formed on the p-type contact layer 6 by CVD (chemical vapor deposition) or the like. This $SiO_2$ film is patterned by photolithography and wet etching, thereby forming an $SiO_2$ film 9 shown in FIGS. 4 and 5. The $SiO_2$ film 9 is employed as an etching mask for patterning the p-type contact layer 6 while removing the p-type cladding layer 5 by a thickness of about 0.2 µm by RIE (reactive ion etching) or the like. In this case, the thickness of a projection of the p-type cladding layer 5 is about 0.3 µm, while that of the remaining portions of the p-type cladding layer 5 is about 0.1 µm. Thus, a ridge portion (see FIG. 4) is formed by the projection of the p-type cladding layer 5 and the p-type contact layer 6. Thereafter the $SiO_2$ film 9 is removed.

Figure 6:
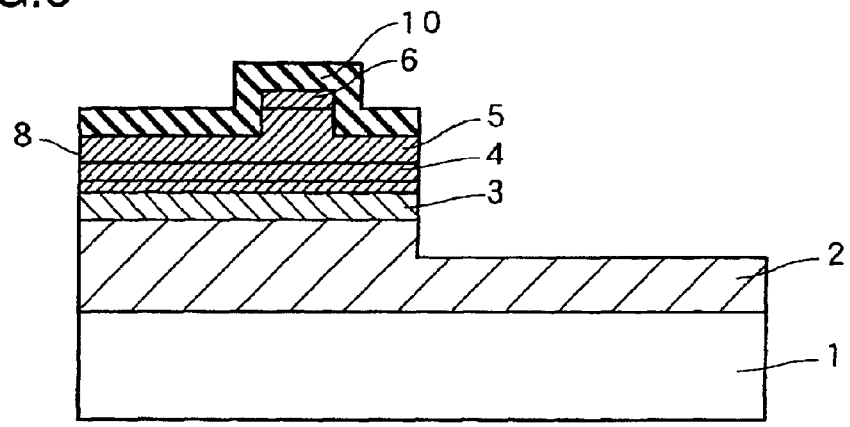
FIG. 6 is a sectional view of the nitride-based semiconductor laser device along the direction perpendicular to the cavity direction for illustrating the method of fabricating a nitride-based semiconductor laser device according to the first embodiment of the present invention.
Figure 7:
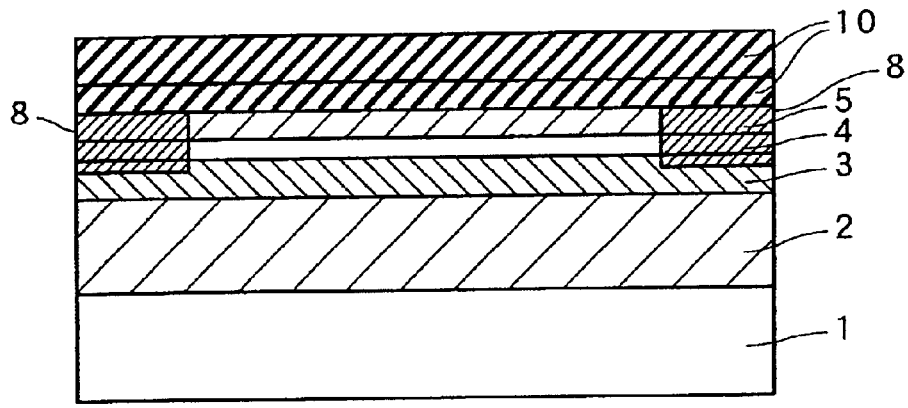
FIG. 7 is a side elevational view of the nitride-based semiconductor laser device according to the first embodiment shown in FIG. 6.

As shown in FIGS. 6 and 7, an $SiO_2$ film is formed to cover the upper surface of the p-type cladding layer 5 and the ridge portion and thereafter patterned by photolithography and wet etching, thereby forming an $SiO_2$ film 10. Thereafter the $SiO_2$ film 10 is employed as an etching mask for partially removing the p-type cladding layer 5, the MQW active layer 4, the n-type cladding layer 3 and the n-type contact layer 2 by RIE or the like. Thereafter the $SiO_2$ film 10 is removed.

Figure 8:
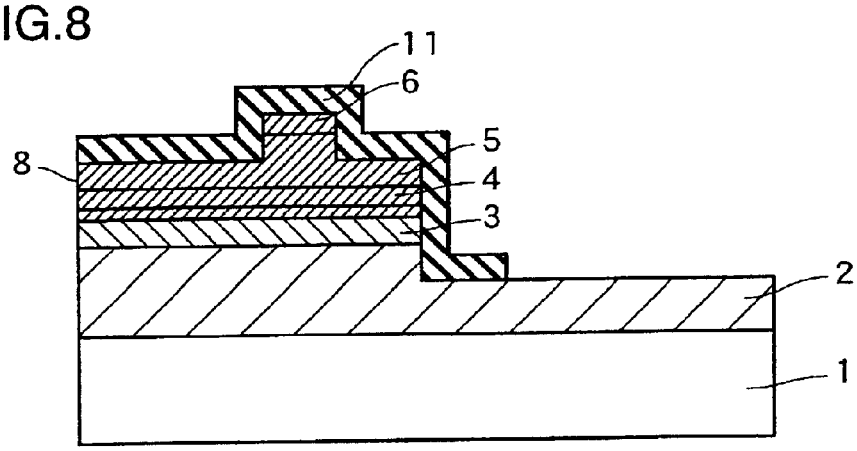
FIG. 8 is a sectional view of the nitride-based semiconductor laser device along the direction perpendicular to the cavity direction for illustrating the method of fabricating a nitride-based semiconductor laser device according to the first embodiment of the present invention.
Figure 9:
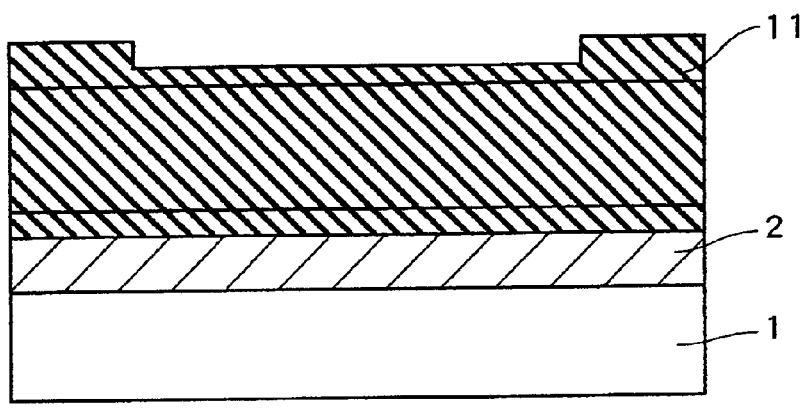
FIG. 9 is a side elevational view of the nitride-based semiconductor laser device according to the first embodiment shown in FIG. 8.

An $SiO_2$ film is formed to cover the overall surface of the wafer and thereafter partially removed from the region on the p-type contact layer 6 excluding the high-resistance regions 8 and a partial surface region of the n-type contact layer 2, thereby forming a current blocking layer 11 of $SiO_2$ shown in FIGS. 8 and 9.

Figure 10:
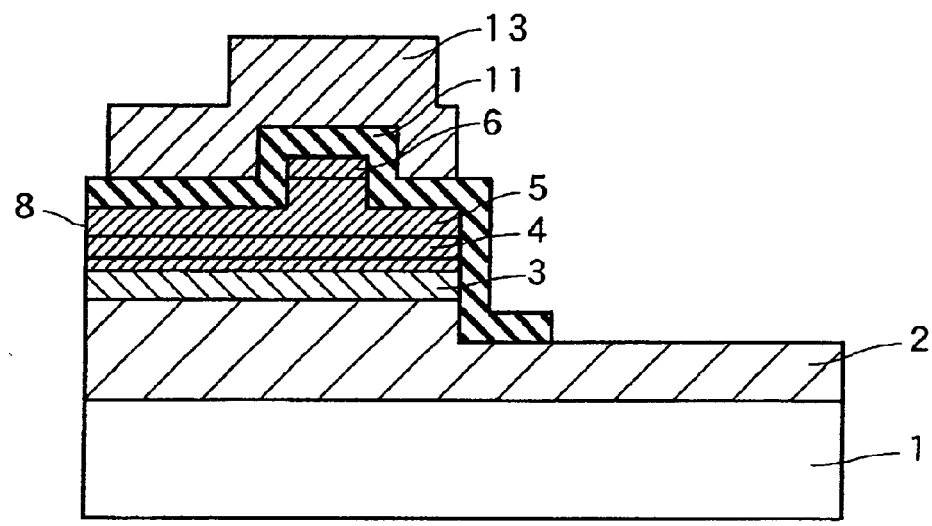
FIG. 10 is a sectional view of the nitride-based semiconductor laser device along the direction perpendicular to the cavity direction for illustrating the method of fabricating a nitride-based semiconductor laser device according to the first embodiment of the present invention.
Figure 11:
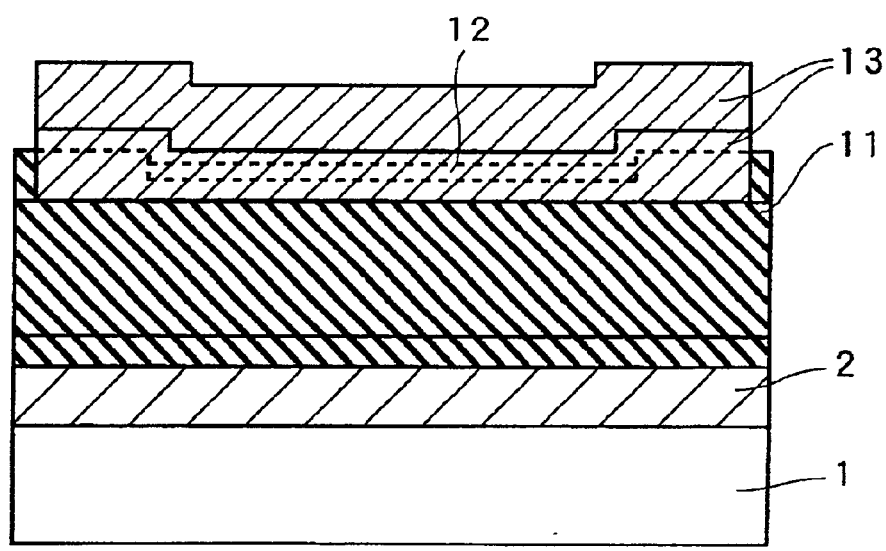
FIG. 11 is a side elevational view of the nitride-based semiconductor laser device according to the first embodiment shown in FIG. 10.

Then, a p-side ohmic electrode 12 (see FIG. 11) consisting of a Pt layer having a thickness of about 1 nm and a Pd layer having a thickness of about 3 nm is formed on the portion of the p-type contact layer 6 formed with no current blocking layer 11 (the portion of the p-type contact layer 6 excluding the high-resistance regions 8). As shown in FIGS. 10 and 11, a p-side pad electrode 13 consisting of an Ni layer having a thickness of about 0.1 µm and an Au layer having a thickness of about 3 µm is formed to cover the current blocking layer 11 and the p-side ohmic electrode 12 located on the p-type cladding layer 5.

Figure 12:
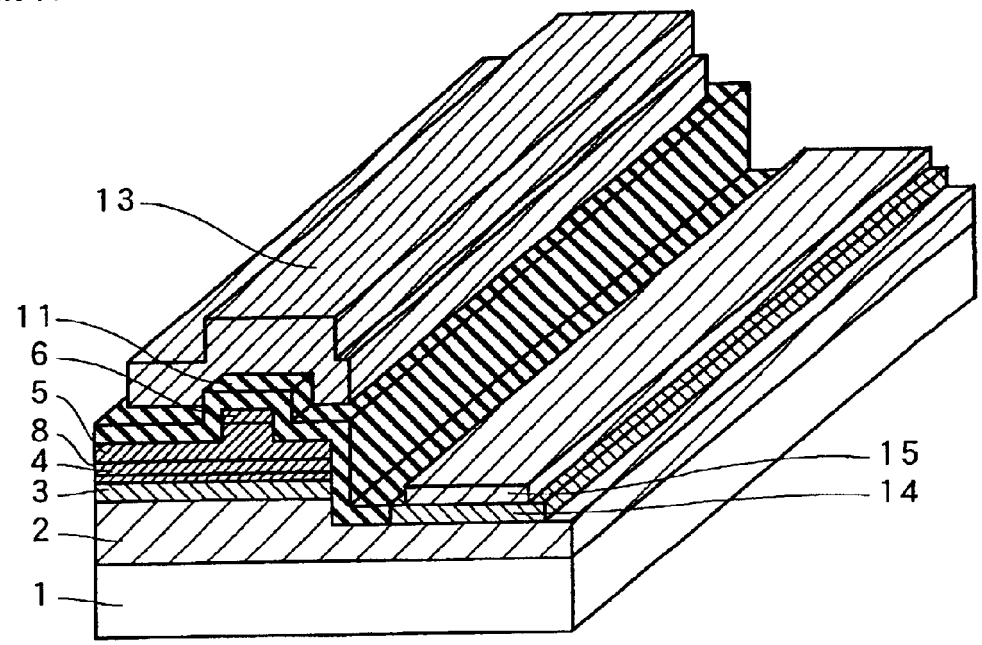
FIG. 12 is a perspective view showing the nitride-based semiconductor laser device according to the first embodiment of the present invention.

As shown in FIG. 12, an n-side ohmic electrode 14 consisting of a Ti layer having a thickness of about 10 nm and an Al layer having a thickness of about 0.1 µm is formed on a portion of the n-type contact layer 2, exposed by etching, formed with no current blocking layer 11. An n-side pad electrode 15 consisting of an Ni layer having a thickness of about 0.1 µm and an Au layer having a thickness of about 3 µm is formed on the n-side ohmic electrode 14. Thus, the nitride-based semiconductor laser device according to the first embodiment is formed.

According to the first embodiment, Zn having a lower p-type activation efficiency than Mg is introduced into the p-type cladding layer 5 previously doped with Mg by thermal diffusion as described above, whereby the high-resistance regions 8 of the p-type cladding layer 5 exhibit higher resistance than the remaining region of the p-type cladding layer 5. Thus, the high-resistance regions 8 formed in the regions of the n-type cladding layer 3, the MQW active layer 4 and the p-type cladding layer 5 close to the facets exhibit higher resistance than the remaining regions, whereby a current hardly flows to the high-resistance regions 8. Consequently, temperature increase resulting from a non-radiative recombination current is suppressed in the vicinity of the facets, whereby deterioration can be prevented in the vicinity of the facets.

According to the first embodiment, the current blocking layer 11 is formed above the high-resistance regions 8 as described above, whereby the current more hardly flows in the vicinity of the facets. Consequently, deterioration can be further suppressed in the vicinity of the facets.

(Second Embodiment)

Figure 13:
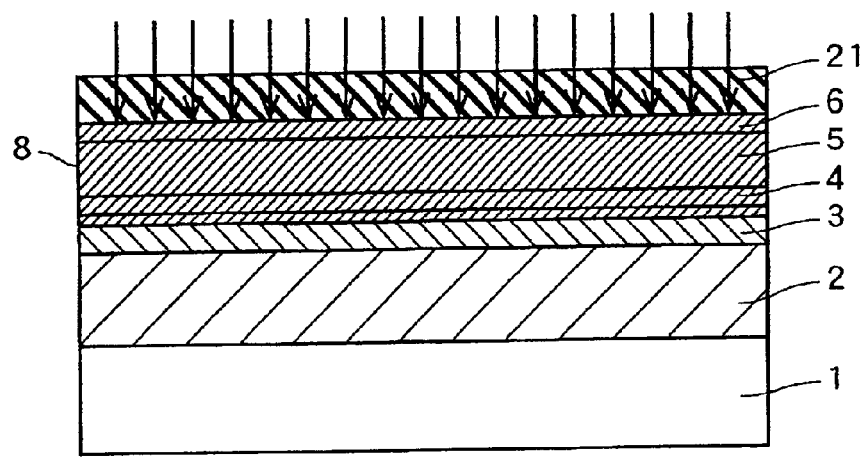
FIG. 13 is a sectional view of a nitride-based semiconductor laser device along a direction perpendicular to a cavity direction for illustrating a method of fabricating a nitride-based semiconductor laser device according to a second embodiment of the present invention.
Figure 14:
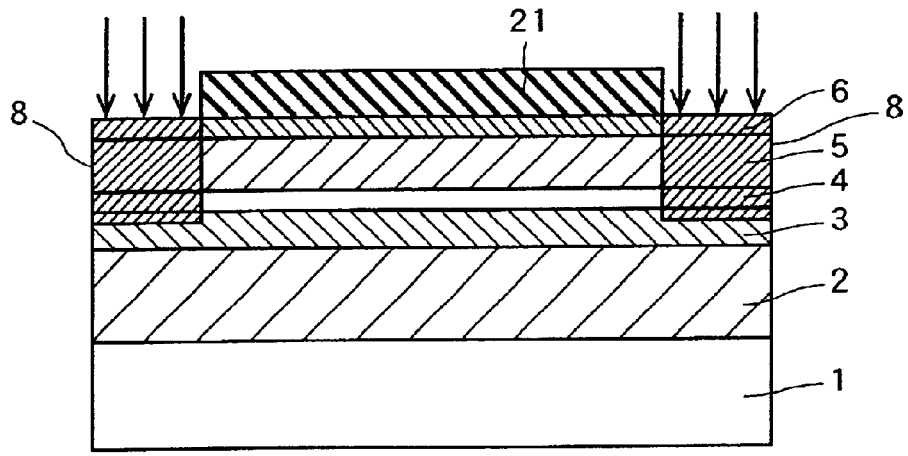
FIG. 14 is a side elevational view of the nitride-based semiconductor laser device according to the second embodiment shown in FIG. 13.

Referring to FIGS. 13 and 14, high-resistance regions 8 are formed by ion implantation and diffusion through an $SiO_2$ film 21 serving as a mask in a second embodiment of the present invention, in place of the high-resistance regions 8 formed through the ZnO films 7 in the first embodiment shown in FIGS. 2 and 3. A method of fabricating a nitride-based semiconductor laser device according to the second embodiment is similar to the method of fabricating a nitride-based semiconductor laser device according to the first embodiment shown in FIGS. 1 and 4 to 12 except a step of forming the high-resistance regions 8. The method of fabricating a nitride-based semiconductor laser device according to the second embodiment of the present invention is now described with reference to FIGS. 13 and 14.

First, an n-type contact layer 2, an n-type cladding layer 3, an MQW active layer 4, a p-type cladding layer 5 and a p-type contact layer 6 are formed on a sapphire substrate 1 by MOCVD, similarly to the method according to the first embodiment shown in FIG. 1.

Then, an SiO$_2$ film is formed on the p-type contact layer 6 and thereafter patterned by photolithography and wet etching in the second embodiment, as shown in FIGS. 13 and 14. Thus, the SiO$_2$ film 21 having openings of about 40 μm in length along a cavity direction is formed in a cycle (the length of the cavity of the nitride-based semiconductor laser device according to the second embodiment) of about 1000 μm to locate the openings in the vicinity of facets. Referring to FIG. 14 corresponding to a single nitride-based semiconductor laser device, the length of the openings of the SiO$_2$ film 21 along the cavity direction is about 20 μm.

Thereafter the SiO$_2$ film 21 is employed as a mask for ion-implanting Zn under conditions of an accelerating voltage of about 300 keV and a dose of about $5 \times 10^{12}$ cm$^{-2}$. Thus, Zn ions are introduced into partial regions of the p-type cladding layer 5, the MQW active layer 4 and the n-type cladding layer 3. The wafer is introduced into a thermal diffusion furnace held at a temperature of about 800° C. and annealed for about 30 minutes, thereby diffusing the ion-implanted Zn and recovering crystallinity. Thus, the high-resistance regions 8 are formed under the regions, containing the introduced Zn, formed with no SiO$_2$ film 21 in the vicinity of the facets. Zn having a lower p-type activation efficiency than Mg is introduced into the p-type cladding layer 5 previously doped with Mg, whereby the high-resistance regions 8 exhibit higher resistance than the region of the p-type cladding layer 5 containing no Zn. Thereafter the SiO$_2$ film 21 is removed.

Figure 4:
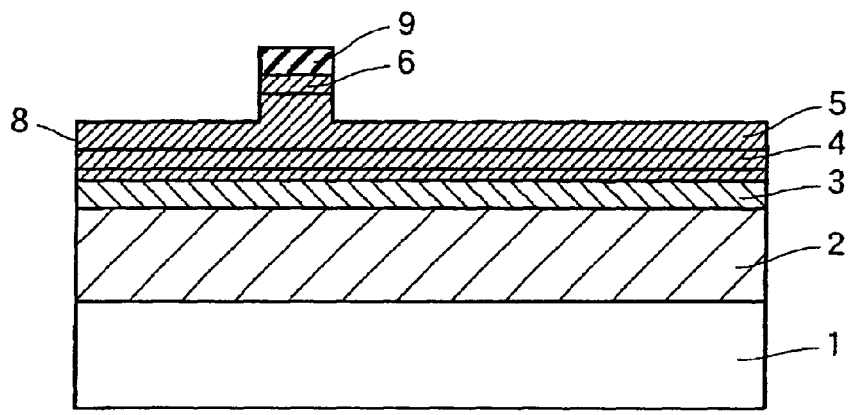
FIG. 4 is a sectional view of the nitride-based semiconductor laser device along the direction perpendicular to the cavity direction for illustrating the method of fabricating a nitride-based semiconductor laser device according to the first embodiment of the present invention.
Figure 5:
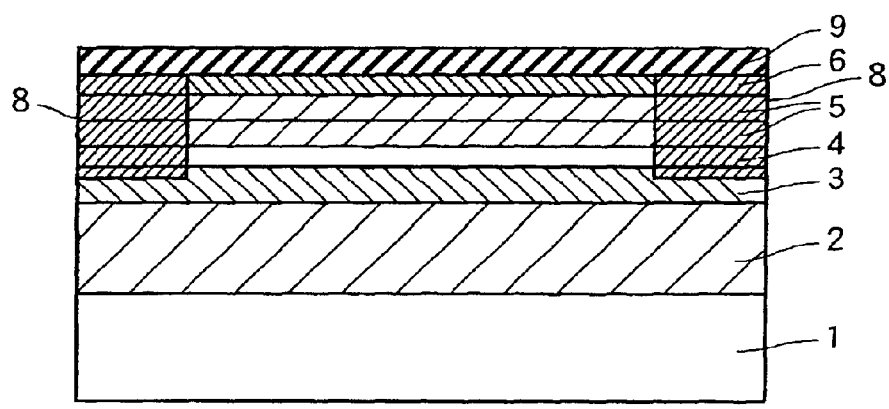
FIG. 5 is a side elevational view of the nitride-based semiconductor laser device according to the first embodiment shown in FIG. 4.

Then, the nitride-based semiconductor laser device according to the second embodiment is formed by a method similar to that for fabricating the nitride-based semiconductor laser device according to the first embodiment shown in FIGS. 4 to 12. First, an SiO$_2$ film 9 is formed on the p-type contact layer 6, as shown in FIGS. 4 and 5. The SiO$_2$ film 9 is employed as an etching mask for forming a ridge portion consisting of a projection of the p-type cladding layer 5 and the p-type contact layer 6 by RIE or the like. Thereafter the SiO$_2$ film 9 is removed.

As shown in FIGS. 6 and 7, an SiO$_2$ film is formed to cover the upper surface of the p-type cladding layer 5 and the ridge portion and thereafter patterned by photolithography and wet etching, thereby forming an SiO$_2$ film 10. Thereafter the SiO$_2$ film 10 is employed as an etching mask for partially removing the p-type cladding layer 5, the MQW active layer 4, the n-type cladding layer 3 and the n-type contact layer 2 by RIE or the like. Thereafter the SiO$_2$ film 10 is removed.

An SiO$_2$ film is formed to cover the overall surface of the wafer and thereafter partially removed from the region on the p-type contact layer 6 excluding the high-resistance regions 8 and a partial surface region of the n-type contact layer 2, thereby forming a current blocking layer 11 of SiO$_2$ as shown in FIGS. 8 and 9.

Then, a p-side ohmic electrode 12 is formed on the portion of the p-type contact layer 6 formed with no current blocking layer 11 (the portion of the p-type contact layer 6 excluding the high-resistance regions 8), as shown in FIGS. 10 and 11. Further, a p-side pad electrode 13 is formed to cover the current blocking layer 11 and the p-side ohmic electrode 12 located on the p-type cladding layer 5 while partially exposing the current blocking layer 11 in the vicinity of the facets.

As shown in FIG. 12, an n-side ohmic electrode 14 and an n-side pad electrode 15 are formed on a portion of the n-type contact layer 2, exposed by etching, formed with no current blocking layer 11. Thus, the nitride-based semiconductor laser device according to the second embodiment is formed in a structure similar to that of the nitride-based semiconductor laser device according to the first embodiment.

According to the second embodiment, Zn having a lower p-type activation efficiency than Mg is introduced into the p-type cladding layer 5 previously doped with Mg by ion implantation and diffusion as described above, whereby the high-resistance regions 8 of the p-type cladding layer 5 exhibit higher resistance than the remaining region of the p-type cladding layer 5. Thus, the high-resistance regions 8 formed in the regions of the n-type cladding layer 3, the MQW active layer 4 and the p-type cladding layer 5 close to the facets exhibit higher resistance than the remaining regions, whereby a current hardly flows to the high-resistance regions 8. Consequently, temperature increase resulting from a non-radiative recombination current is suppressed in the vicinity of the facets similarly to the first embodiment, whereby deterioration can be prevented in the vicinity of the facets.

According to the second embodiment, the current blocking layer 11 is formed above the high-resistance regions 8 as described above, whereby the current more hardly flows in the vicinity of the facets. Consequently, deterioration can be further suppressed in the vicinity of the facets similarly to the first embodiment.

(Third Embodiment)

According to a third embodiment of the present invention, thermal diffusion conditions different from those in the first embodiment are employed for forming high-resistance regions 8 through ZnO films 7 as shown in FIGS. 2 and 3. A method of fabricating a nitride-based semiconductor laser device according to the third embodiment is similar to the method of fabricating a nitride-based semiconductor laser device according to the first embodiment shown in FIGS. 1 to 12 except a step of forming the high-resistance regions 8. The third embodiment is now described in detail.

First, an n-type contact layer 2, an n-type cladding layer 3, an MQW active layer 4, a p-type cladding layer 5 and a p-type contact layer 6 are formed on a sapphire substrate 1 by MOCVD, similarly to the method according to the first embodiment shown in FIG. 1. As shown in FIGS. 2 and 3, patterned ZnO films 7 are formed on the p-type contact layer 6, similarly to the first embodiment.

According to the third embodiment, the wafer formed with the ZnO films 7 is arranged in a thermal diffusion furnace held at a temperature of about 850° C., and annealed for about 60 minutes. Thus, Zn is introduced into partial regions of the p-type cladding layer 5, the MQW active layer 4 and the n-type cladding layer 3 thereby forming the high-resistance regions 8 under the ZnO films 7 (in the vicinity of facets).

According to the third embodiment, the conditions for annealing are set to a higher temperature and a longer time than those in the first embodiment, for introducing a larger quantity of Zn into the high-resistance regions 8 as compared with the first embodiment. Therefore, a large quantity of Zn is introduced into the MQW active layer 4 for disordering the periodic structure in the high-resistance regions 8 of the MQW active layer 4 having a quantum well structure. Thus, band gaps of the high-resistance regions 8 of the MQW active layer 4 are larger than that of the remaining region of the MQW active layer 4. Thereafter the ZnO films 7 are removed.

Thereafter the nitride-based semiconductor laser device according to the third embodiment is completed through a process similar to the process of fabricating a nitride-based semiconductor laser device according to the first embodiment shown in FIGS. 4 to 12.

According to the third embodiment, Zn is thermally diffused under conditions of a higher temperature (about 850° C.) and a longer time (about 60 minutes) as compared with the thermal diffusion conditions (the temperature of about 800° C. and the time of about 30 minutes) for Zn according to the first embodiment as hereinabove described, whereby a larger quantity of Zn is introduced into the high-resistance regions 8 as compared with the first embodiment. Therefore, the periodic structure is disordered in the high-resistance regions 8 of the MQW active layer 4 having a quantum well structure, whereby the band gaps of the high-resistance regions of the MQW active layer 4 are larger than that of the remaining region of the MQW active layer 4. Thus, the high-resistance regions 8 can be inhibited from absorbing a laser beam. Consequently, deterioration can be more effectively prevented in the vicinity of the facets.

According to the third embodiment, Zn having a lower p-type activation efficiency than Mg is introduced into the p-type cladding layer 5 previously doped with Mg by thermal diffusion similarly to the aforementioned first embodiment, whereby the high-resistance regions 8 exhibit higher resistance than the remaining region of the p-type cladding layer 5. Thus, the high-resistance regions 8 formed in the regions of the n-type cladding layer 3, the MQW active layer 4 and the p-type cladding layer 5 close to the facets exhibit higher resistance than the remaining regions, whereby a current hardly flows to the high-resistance regions 8. Consequently, temperature increase resulting from a non-radiative recombination current is suppressed in the vicinity of the facets, whereby deterioration can be prevented in the vicinity of the facets.

According to the third embodiment, a current blocking layer 11 is formed above the high-resistance regions 8 similarly to the aforementioned first and second embodiments, whereby the current more hardly flows in the vicinity of the facets. Consequently, deterioration can be further suppressed in the vicinity of the facets.

(Fourth Embodiment)

According to a fourth embodiment of the present invention, conditions of ion implantation and diffusion different from those in the second embodiment are employed for forming high-resistance regions 8 as shown in FIGS. 13 and 14. A method of fabricating a nitride-based semiconductor laser device according to the fourth embodiment is similar to the method of fabricating a nitride-based semiconductor laser device according to the first embodiment shown in FIGS. 1 to 12 except a step of forming the high-resistance regions 8. The fourth embodiment is now described in detail.

First, an n-type contact layer 2, an n-type cladding layer 3, an MQW active layer 4, a p-type cladding layer 5 and a p-type contact layer 6 are formed on a sapphire substrate 1 by MOCVD, similarly to the method according to the first embodiment shown in FIG. 1. Then, a patterned $SiO_2$ film 21 is formed on the p-type contact layer 6 similarly to the second embodiment, as shown in FIGS. 13 and 14.

According to the fourth embodiment, the $SiO_2$ film 21 is employed as a mask for ion-implanting Zn under conditions of an accelerating voltage of about 400 keV and a dose of about $5 \times 10^{13}$ cm$^{-2}$ while recovering crystallinity. Then, the wafer is arranged in a thermal diffusion furnace held at a temperature of about 850° C., and annealed for about 60 minutes. Thus, Zn is introduced into partial regions of the p-type cladding layer 5, the MQW active layer 4 and the n-type cladding layer 3 thereby forming the high-resistance regions 8 in the vicinity of facets, similarly to the second embodiment.

According to the fourth embodiment, the ion implantation conditions are set to a higher accelerating voltage and a larger dose and the annealing conditions are set to a higher temperature and a longer time as compared with the second embodiment, for ion-implanting and diffusing a larger quantity of Zn into the high-resistance regions 8 as compared with the second embodiment. Therefore, a large quantity of Zn is introduced into the MQW active layer 4 for disordering the periodic structure in the high-resistance regions 8 of the MQW active layer 4 having a quantum well structure. Thus, band gaps of the high-resistance regions 8 of the MQW active layer 4 are larger than that of the remaining region of the MQW active layer 4. Thereafter the $SiO_2$ film 21 is removed.

Thereafter the nitride-based semiconductor laser device according to the fourth embodiment is completed through a process similar to the process of fabricating a nitride-based semiconductor laser device according to the first embodiment shown in FIGS. 4 to 12.

According to the fourth embodiment, Zn is ion-implanted under conditions of a higher accelerating voltage (about 400 keV) and a larger dose (about $5 \times 10^{13}$ cm$^{-2}$) as compared with the ion implantation conditions (the accelerating voltage of about 300 keV and the dose of about $5 \times 10^{12}$ cm$^{-2}$) according to the second embodiment and diffused under conditions of a higher temperature (about 850° C.) and a longer time (about 60 minutes) as compared with the diffusion conditions (the temperature of about 800° C. and the time of about 30 minutes) for Zn according to the second embodiment as hereinabove described, whereby a larger quantity of Zn is ion-implanted and diffused into the high-resistance regions 8 as compared with the second embodiment. Therefore, the periodic structure is disordered in the high-resistance regions 8 of the MQW active layer 4 having a quantum well structure, whereby the band gaps of the high-resistance regions of the MQW active layer 4 are larger than that of the remaining region of the MQW active layer 4. Thus, the high-resistance regions 8 can be inhibited from absorbing a laser beam. Consequently, deterioration can be more effectively prevented in the vicinity of the facets.

According to the fourth embodiment, Zn having a lower p-type activation efficiency than Mg is introduced into the p-type cladding layer 5 previously doped with Mg by ion implantation and diffusion similarly to the aforementioned second embodiment, whereby the high-resistance regions 8 exhibit higher resistance than the remaining region of the p-type cladding layer 5. Thus, the high-resistance regions 8 formed in the regions of the n-type cladding layer 3, the MQW active layer 4 and the p-type cladding layer 5 close to the facets exhibit higher resistance than the remaining regions, whereby a current hardly flows to the high-resistance regions 8. Consequently, temperature increase resulting from a non-radiative recombination current is suppressed in the vicinity of the facets, whereby deterioration can be prevented in the vicinity of the facets.

According to the fourth embodiment, a current blocking layer 11 is formed above the high-resistance regions 8 similarly to the aforementioned first to third embodiments, whereby the current more hardly flows in the vicinity of the facets. Consequently, deterioration can be further suppressed in the vicinity of the facets.

(Fifth Embodiment)

Referring to FIGS. 15 to 19, a p-side ohmic electrode 32 similar to the p-side ohmic electrode 12 according to the first embodiment shown in FIG. 11 is formed also on portions of high-resistance regions 8 of a p-type contact layer 6 in a fifth embodiment of the present invention. A method of fabricating a nitride-based semiconductor laser device according to the fifth embodiment is similar to the method of fabricating a nitride-based semiconductor laser device according to the first embodiment shown in FIGS. 1 to 12 except a current blocking layer 11 and the p-side ohmic electrode 32 on the p-type contact layer 6. The fifth embodiment is now described in detail.

First, an n-type contact layer 2, an n-type cladding layer 3, an MQW active layer 4, a p-type cladding layer 5 and a p-type contact layer 6 are formed on a sapphire substrate 1 by MOCVD, similarly to the method according to the first embodiment shown in FIG. 1. As shown in FIGS. 2 and 3, patterned ZnO films 7 are formed on the p-type contact layer 6, similarly to the first embodiment.

Then, the wafer is arranged in a thermal diffusion furnace held at a temperature of about 800° C., and annealed for about 30 minutes. Thus, Zn is introduced into partial regions of the p-type cladding layer 5, the MQW active layer 4 and the n-type cladding layer 3, thereby forming the high-resistance regions 8 under the ZnO films 7 (in the vicinity of facets). Thereafter the ZnO films 7 are removed.

Then, the nitride-based semiconductor laser device according to the fifth embodiment is formed by a method similar to that for fabricating the nitride-based semiconductor laser device according to the first embodiment shown in FIGS. 4 to 7. First, an $SiO_2$ film 9 is formed on the p-type contact layer 6, as shown in FIGS. 4 and 5. The $SiO_2$ film 9 is employed as an etching mask for forming a ridge portion consisting of a projection of the p-type cladding layer 5 and the p-type contact layer 6 by RIE or the like. Thereafter the $SiO_2$ film 9 is removed.

As shown in FIGS. 6 and 7, an $SiO_2$ film is formed to cover the upper surface of the p-type cladding layer 5 and the ridge portion and thereafter patterned by photolithography and wet etching, thereby forming an $SiO_2$ film 10. Thereafter the $SiO_2$ film 10 is employed as an etching mask for partially removing the p-type cladding layer 5, the MQW active layer 4, the n-type cladding layer 3 and the n-type contact layer 2 by RIE or the like. Thereafter the $SiO_2$ film 10 is removed.

Figure 15:
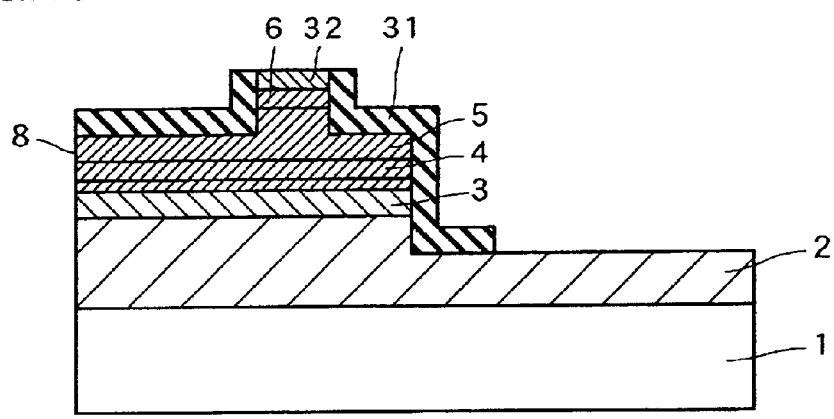
FIG. 15 is a sectional view of a nitride-based semiconductor laser device along a direction perpendicular to a cavity direction for illustrating a method of fabricating a nitride-based semiconductor laser device according to a fifth embodiment of the present invention.
Figure 16:
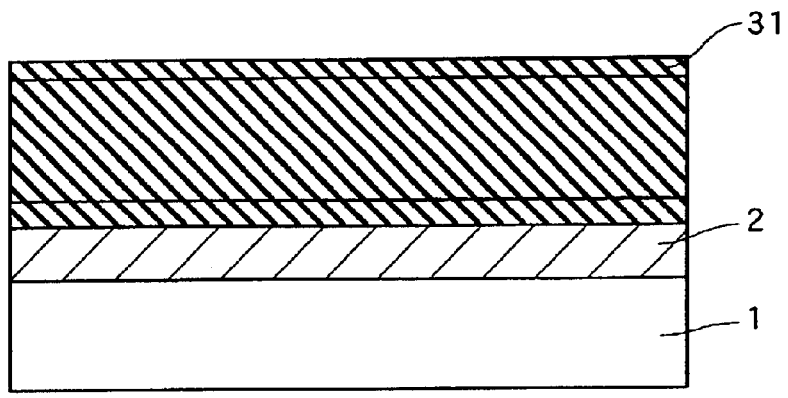
FIG. 16 is a side elevational view of the nitride-based semiconductor laser device according to the fifth embodiment shown in FIG. 15.

According to the fifth embodiment, the p-side ohmic electrode 32 is formed to be in contact with the overall upper surface of the p-type contact layer 6, as shown in FIGS. 15 and 16. An $SiO_2$ film is formed to cover the overall surface of the wafer and thereafter partially removed from the overall upper surface of the p-side ohmic electrode 32 and a partial surface region of the n-type contact layer 2, thereby forming a current blocking layer 31 of $SiO_2$. According to the fifth embodiment, the current blocking layer 31 is not formed on the upper surface of the p-side ohmic electrode 32 formed on the high-resistance regions 8, dissimilarly to the aforementioned first to fourth embodiments.

Figure 17:
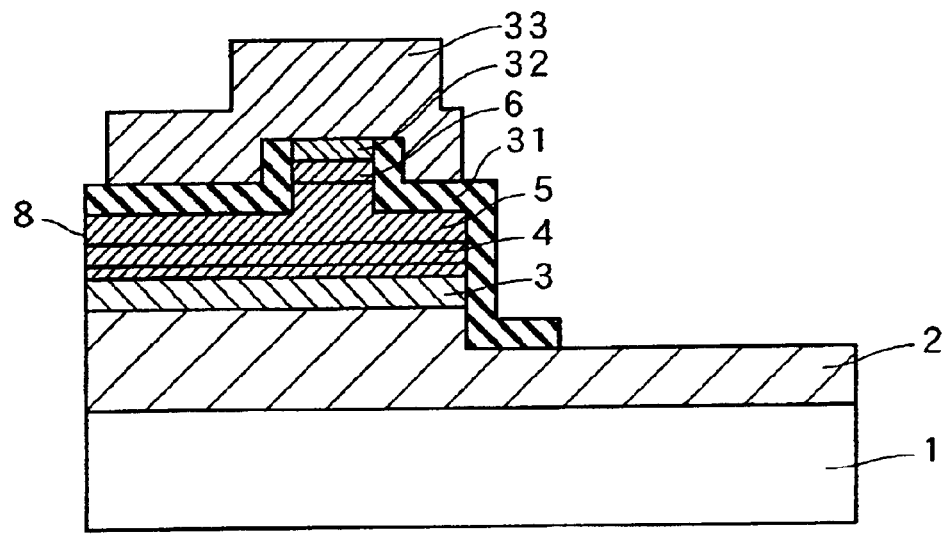
FIG. 17 is a sectional view of the nitride-based semiconductor laser device along the direction perpendicular to the cavity direction for illustrating the method of fabricating a nitride-based semiconductor laser device according to the fifth embodiment of the present invention.
Figure 18:
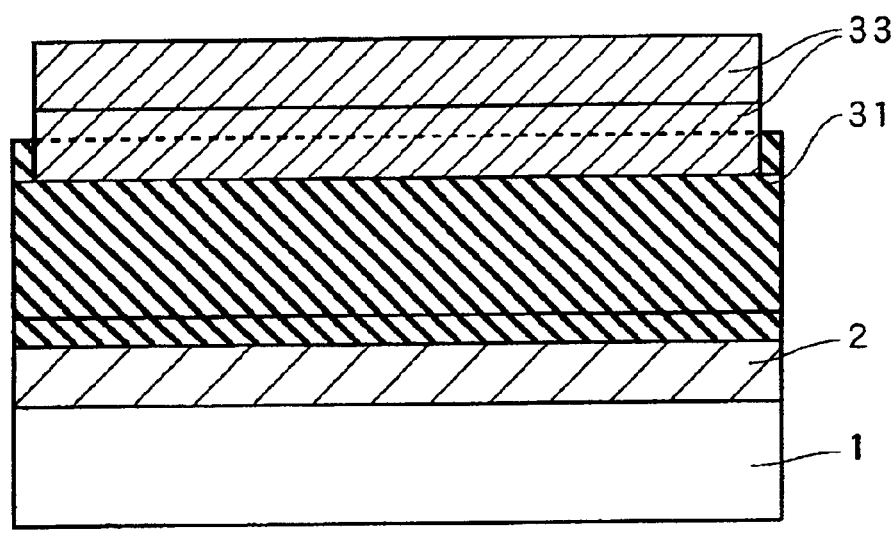
FIG. 18 is a side elevational view of the nitride-based semiconductor laser device according to the fifth embodiment shown in FIG. 17.

As shown in FIGS. 17 and 18, a p-side pad electrode 33 is formed to cover the current blocking layer 31 and the p-side ohmic electrode 32 on the p-type cladding layer 5.

Figure 19:
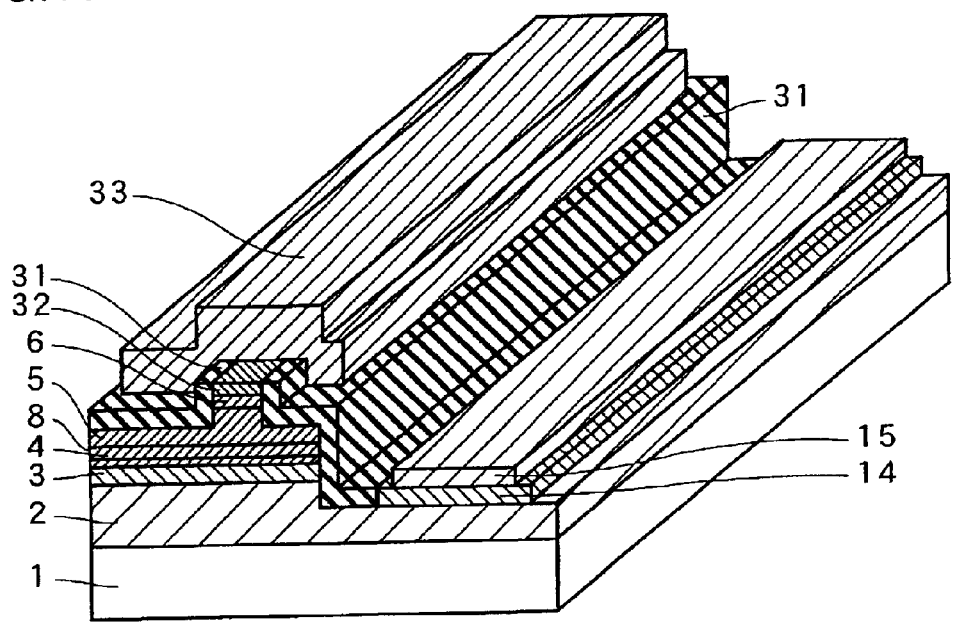
FIG. 19 is a perspective view showing the nitride-based semiconductor laser device according to the fifth embodiment of the present invention.
Figure 20:
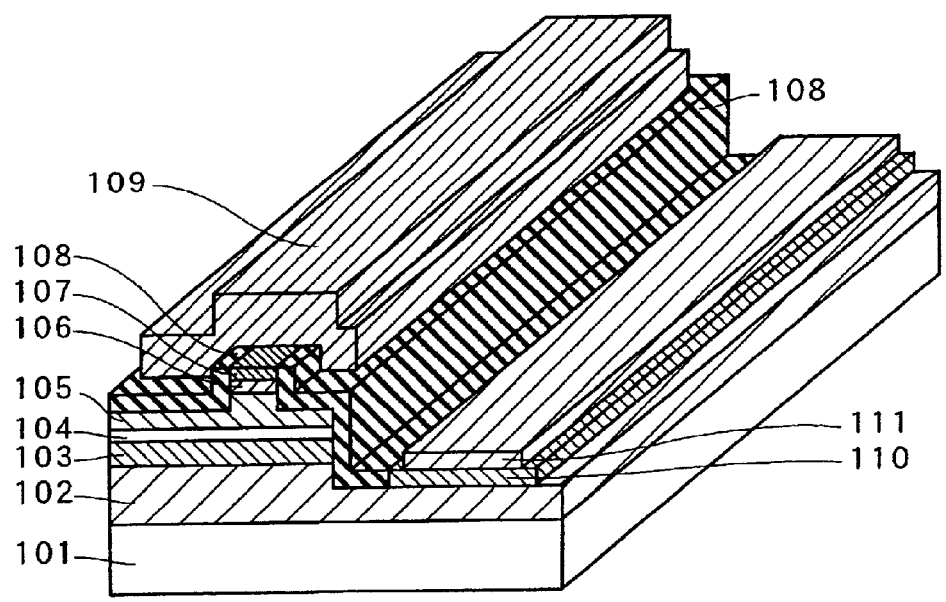
FIG. 20 is a perspective view showing a conventional nitride-based semiconductor laser device.

As shown in FIG. 19, an n-side ohmic electrode 14 and an n-side pad electrode 15 are formed on the portion of the n-type contact layer 2, exposed by etching, formed with no current blocking layer 31. Thus, the nitride-based semiconductor laser device according to the fifth embodiment is formed.

According to the fifth embodiment, the current blocking layer 31 is not formed on the upper surface of the p-side ohmic electrode 32 located on the high-resistance regions 8 as described above, and hence a slight current flows in the vicinity of the facets. As compared with the first to fourth embodiments, therefore, an operating current for obtaining the same light output power is slightly increased as compared with the first to fourth embodiments. As compared with a conventional nitride-based semiconductor laser device having no high-resistance regions 8, however, the quantity of the current flowing in the vicinity of the facets can be reduced, thereby reducing absorption of a laser beam in the high-resistance regions 8. Consequently, deterioration can be suppressed in the vicinity of the facets.

Although the present invention has been described and illustrated in detail, it is clearly understood that the same is by way of illustration and example only and is not to be taken by way of limitation, the spirit and scope of the present invention being limited only by the terms of the appended claims.

For example, while the high-resistance regions 8 are formed in the vicinity of the facets by introducing Zn by ion implantation and diffusion in each of the aforementioned second and fourth embodiments, the present invention is not restricted to this but Be, Ca, C or Si may alternatively be ion-implanted as another impurity.

When Be or Ca is ion-implanted in the vicinity of the facets and thereafter diffused thereby forming the high-resistance regions 8, Be or Ca is introduced into the p-type cladding layer 5 previously doped with Mg. Be or Ca has a lower p-type activation efficiency than Mg, and hence the regions of the p-type cladding layer 5 containing the introduced Be or Ca exhibit higher resistance than the remaining region containing no Be or Ca. Thus, a current hardly flows in the high-resistance regions 8, containing the introduced Be or Ca, in the vicinity of the facets. Consequently, temperature increase is suppressed in the vicinity of the facets, whereby deterioration can be prevented in the vicinity of the facets.

When C or Si is ion-implanted in the vicinity of the facets and thereafter diffused for forming the high-resistance regions 8, C or Si is introduced into the p-type cladding layer 5 previously doped with Mg. C or Si generates electrons in the p-type cladding layer 5 by replacing group III atoms such as Ga atoms forming the nitride-based semiconductor. Thus, the quantity of holes resulting from the doped Mg is reduced due to the introduction of C or Si, whereby the regions of the p-type cladding layer 5 containing the introduced C or Si exhibit higher resistance than the remaining region containing no C or Si. Thus, a current hardly flows in the high-resistance regions 8, containing the introduced C or Si, in the vicinity of the facets. Consequently, temperature increase is suppressed in the vicinity of the facets, whereby deterioration can be prevented in the vicinity of the facets.

While the current blocking layer 11 is formed by an insulator film consisting of $SiO_2$ in each of the aforementioned first to fifth embodiments, the present invention is not restricted to this but the current blocking layer 11 may alternatively be formed by another insulator film consisting of a material other than SiO2. Further, the current blocking layer 11 may be made of a material having an inverse conductivity type (n-type) to the p-type contact layer 6 or the p-type cladding layer 5 formed in contact with the current blocking layer 11.

While the MQW active layer 4 has a periodic structure consisting of a quantum well structure in each of the aforementioned first to fifth embodiments, the present invention is not restricted to this but the MQW active layer 4 may alternatively have a periodic structure consisting of a quantum wire structure or a quantum box structure.

While the current blocking layer 11 is formed on the upper surface portion of the p-type contact layer 6 located on the high-resistance regions 8 in each of the aforementioned first to fourth embodiments, the present invention is not restricted to this but the current blocking layer 11 may alternatively be formed not only on the upper surface portion of the p-type contact layer 6 located on the high-resistance regions 8 but also on the remaining region. In this case, the current more hardly flows in the vicinity of the facets.

While the high-resistance regions 8 are formed in the portions of the p-type cladding layer 3, the MQW active layer 4 and the p-type cladding layer 5 close to the facets in each of the aforementioned first to fifth embodiments, the present invention is not restricted to this but the high-resistance regions 8 may alternatively be formed only in the MQW active layer 4 and the p-type cladding layer 5.

What is claimed is:

1. A nitride-based semiconductor laser device comprising:
   a first conductivity type first cladding layer consisting of a nitride-based semiconductor formed on a substrate;
   an active layer formed on said first cladding layer;
   a second conductivity type second cladding layer consisting of a nitride-based semiconductor formed on said active layer; and
   a high-resistance region formed at least on portions of said active layer and said second cladding layer in the vicinity of a facet, wherein
   said high-resistance region is formed by introducing an impurity into said high-resistance region which impurity has a positive second conductivity type activation efficiency which is lower than the second conductivity type activation efficiency of an impurity previously introduced into said second cladding layer.

2. The nitride-based semiconductor laser device according to claim 1, wherein
   said high-resistance region is formed also on a portion of said first cladding layer in the vicinity of said facet.

3. The nitride-based semiconductor laser device according to claim 1, wherein
   said impurity includes an element selected from a group consisting of Be, Zn, Ca, C and Si, and
   said impurity previously introduced into said second cladding layer is Mg.

4. The nitride-based semiconductor laser device according to claim 3, wherein
   said impurity is Zn, and
   said impurity previously introduced into said second cladding layer is Mg.

5. The nitride-based semiconductor laser device according to claim 1, further comprising a current blocking layer formed at least above said high-resistance region.

6. The nitride-based semiconductor laser device according to claim 5, wherein
   said current blocking layer includes an SiO$_2$ film.

7. The nitride-based semiconductor laser device according to claim 5, wherein
   said current blocking layer includes a layer consisting of a material having a first conductivity type.

8. The nitride-based semiconductor laser device according to claim 1, wherein
   said active layer has a periodic structure consisting of any of a quantum well structure, a quantum wire structure and a quantum box structure, and
   said periodic structure of said active layer in said high-resistance region formed by introducing said impurity is disordered.

9. A method of fabricating a nitride-based semiconductor laser device comprising steps of:
   forming a first conductivity type first cladding layer consisting of a nitride-based semiconductor on a substrate;
   forming an active layer on said first cladding layer;
   forming a second conductivity type second cladding layer consisting of a nitride-based semiconductor on said active layer; and
   forming a high-resistance region by introducing an impurity into portions of said first cladding layer, said active layer and said second cladding layer in the vicinity of a facet, wherein the impurity introduced into the high resistance region has a positive second conductivity type activation efficiency which is lower than the second conductivity type activation efficiency of an impurity previously introduced into the second cladding layer.

10. The method of fabricating a nitride-based semiconductor laser device according to claim 9, wherein
    said step of forming said high-resistance region includes a step of forming a layer containing said impurity on said second cladding layer and thereafter thermally diffusing said impurity into said portions of said second cladding layer, said active layer and said first cladding layer in the vicinity of said facet from said layer containing said impurity thereby forming said high-resistance region on said portions of said second cladding layer, said active layer and said first cladding layer in the vicinity of said facet.

11. The method of fabricating a nitride-based semiconductor laser device according to claim 10, wherein
    said layer containing said impurity includes a ZnO film.

12. The method of fabricating a nitride-based semiconductor laser device according to claim 9, wherein
    said step of forming said high-resistance region includes a step of ion-implanting said impurity into said second cladding layer, said active layer and said first cladding layer thereby forming said high-resistance region on said portions of said first cladding layer, said active layer and said second cladding layer in the vicinity of said facet.

13. The method of fabricating a nitride-based semiconductor laser device according to claim 12, wherein
    said step of forming said high-resistance region includes steps of:
    forming a mask layer having an opening in the vicinity of said facet, and
    ion-implanting said impurity into said second cladding layer, said active layer and said first cladding layer through said mask layer serving as a mask thereby forming said high-resistance region.

14. The method of fabricating a nitride-based semiconductor laser device according to claim 12, wherein
said step of forming said high-resistance region includes a step of diffusing said ion-implanted impurity by performing heat treatment after said ion implantation.

15. The method of fabricating a nitride-based semiconductor laser device according to claim 9, wherein
said impurity includes an impurity selected from a group consisting of Be, Zn, Ca, C and Si, and
said impurity previously introduced into said second cladding layer is Mg.

16. The method of fabricating a nitride-based semiconductor laser device according to claim 15, wherein
said impurity is Zn, and
said impurity previously introduced into said second cladding layer is Mg.

17. The method of fabricating a nitride-based semiconductor laser device according to claim 9, further comprising a step of forming a current blocking layer at least above said high-resistance region.

18. The method of fabricating a nitride-based semiconductor laser device according to claim 17, wherein
said current blocking layer includes an $SiO_2$ film.

19. The method of fabricating a nitride-based semiconductor laser device according to claim 17, wherein
said current blocking layer includes a layer consisting of a material having a first conductivity type.

20. The method of fabricating a nitride-based semiconductor laser device according to claim 9, wherein
said active layer has a periodic structure consisting of any of a quantum well structure, a quantum wire structure and a quantum box structure, and
said step of forming said high-resistance region includes a step of disordering said periodic structure of said active layer in the vicinity of said facet by introducing said impurity into said portions of said second cladding layer, said active layer and said first cladding layer in the vicinity of said facet.

* * * * *